(12) United States Patent
Saito

(10) Patent No.: US 6,210,818 B1
(45) Date of Patent: Apr. 3, 2001

(54) MAGNETORESISTIVE ELEMENT

(75) Inventor: Masamichi Saito, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/170,786

(22) Filed: Oct. 13, 1998

(30) Foreign Application Priority Data

Oct. 20, 1997 (JP) .................................................. 9-286893

(51) Int. Cl.$^7$ ...................................................... G11B 5/66
(52) U.S. Cl. ................. 428/692; 423/694 R; 423/694 T; 423/694 TS; 423/900; 360/113; 324/252
(58) Field of Search ............................... 428/694 R, 692, 428/694 T, 694 TS, 900; 360/113; 324/252

(56) References Cited

U.S. PATENT DOCUMENTS

| | | | |
|---|---|---|---|
| 5,159,513 | 10/1992 | Dieny et al. | 360/324.1 |
| 5,206,590 * | 4/1993 | Dieny et al. | 324/252 |
| 5,287,238 * | 2/1994 | Baumgart et al. | 360/113 |
| 5,373,238 | 12/1994 | McGuire et al. | 324/252 |

* cited by examiner

Primary Examiner—Leszek Kiliman
(74) Attorney, Agent, or Firm—Brinks Hofer Gilson & Lione

(57) ABSTRACT

A spin-valve thin film element comprises a pinned magnetic layer formed of a CoFe alloy or a CoFeNi alloy having adjusted composition ratios. Thus the pinned magnetic layer can have a positive magnetostriction and its magnetization can be induced in the height direction as a function of the magnetoelastic effect. In addition, the pinned magnetic layer can comprise fcc structure at least as a part of its crystal structure so as to give a large exchange anisotropic magnetic field. Accordingly, its magnetization orientation can firmly be fixed in the height direction to give enhanced reproducing characteristics.

38 Claims, 5 Drawing Sheets

MAGNETORESISTIVE ELEMENT

BACKGROUND OF THE INVENTION

1. Field of the Invention

The present invention relates to a "spin-valve type" thin film element, in which the electric resistance varies as a function between the magnetization orientation of a pinned magnetic layer and that of a free magnetic layer, which is free to rotate with an applied magnetic field. The invention further relates to improvement of a magnetic material used as the aforementioned pinned magnetic layer.

2. Description of the Related Art

A spin-valve type thin film element is a kind of giant magnetoresistive (GMR) elements utilizing the giant magnetoresistance effect for detecting a recording magnetic field recorded in a recording medium such as a hard disk.

Such a spin-valve type thin film element is composed of at least four layers, i.e., a free magnetic layer, a nonmagnetic electrically conductive layer, a pinned magnetic layer and an antiferromagnetic layer laminated in this order on a suitable substrate, and pairs of a hard magnetic bias layer and an electric conductive layer are laminated on both sides of the four layers.

In general, the conventional spin-valve type thin film element comprises the antiferromagnetic layer composed of an FeMn (iron-manganese) alloy film or a NiMn (nickel-manganese) alloy film, the pinned magnetic layer and free magnetic layer each composed of a NiFe (nickel-iron) alloy film, the nonmagnetic electrically conductive layer composed of a Cu (copper) film, and the hard magnetic bias layer composed of a Co—Pt (cobalt-platinum) alloy film.

The pinned magnetic layer is formed adjacent to the antiferromagnetic layer. The magnetization of the pinned magnetic layer is put into a single domain state in a height direction (the direction of a leakage magnetic filed leaked from a recording medium) and fixed by forming the pinned magnetic layer in a magnetic filed when the antiferromagnetic layer is composed of an FeMn alloy film, or by annealing it when the antiferromagnetic layer is composed of a NiMn alloy film.

The magnetization orientation of the free magnetic layer is aligned with a track width direction by a bias magnetic field from the hard magnetic bias layer, and the magnetization orientations of the free magnetic layer and the pinned magnetic layer are at an angle of 90° with respect to each other.

In a spin-valve type thin film element, a sensing current is fed from the electric conductive layer to the pinned magnetic layer, nonmagnetic electrically conductive layer and free magnetic layer. When a leakage magnetic field is applied from a recording medium to the element, the magnetization orientation (magnetization direction) of the free magnetic layer rotates from the track width direction to the leakage magnetic field direction (height direction). The electric resistance changes as a function between the variation of the magnetization orientation in the free magnetic layer and the fixed magnetization orientation of the pinned magnetic layer, and consequently the voltage changes according to variation of the electric resistance so as to detect the leakage magnetic filed from the recording medium.

Meanwhile, a large exchange anisotropic magnetic field generated in a boundary face between the pinned magnetic layer and the antiferromagnetic layer is preferred. This is because such a large exchange anisotropic magnetic field can satisfactorily put and fix the magnetization of the pinned magnetic layer into a single domain state in a height direction (leakage magnetic field direction from a recording medium).

To provide a large exchange anisotropic magnetic filed, various inventions and publications have been made in which materials of the antiferromagnetic layer and/or pinned magnetic layer are changed or conditions of a heat treatment to generate an exchange anisotropic magnetic filed are suitably adjusted.

It is, however, not only an exchange anisotropic magnetic filed that affects the magnitude of the magnetization. A magnetic filed generated by a magnetoelastic effect also affects the magnitude of the magnetization of pinned magnetic layer. Such a magnetic filed can be determined by a stress and magnetostriction applied to the pinned magnetic layer.

A spin-valve type thin film element has upper, bottom and height side surfaces covered with an insulation film (gap film) composed of, for example, $Al_2O_3$, and an opposite surface to the height side (i.e., an Air Bearing surface (ABS) side; front surface) exposed to the outside. Since the spin-valve type thin film element is composed of a multilayered structure comprising metal films, its coefficient of thermal expansion is larger than that of the insulation film covering the element. Accordingly, a tensile stress directed to the height direction acts upon the spin-valve type thin film element.

When the pinned magnetic layer constituting the spin-valve type thin film element has a negative magnetostriction under the above mentioned condition, the magnetization of the pinned magnetic layer is induced in the track width direction by the magnetoelastic effect.

To be more specific, even if a large exchange anisotropic magnetic filed can be obtained which can satisfactorily put the magnetization of the pinned magnetic layer into a single domain state in the height direction, when a magnetic filed as a function of the magnetoelastic effect acts for orienting the magnetization of the pinned magnetic layer in the track width direction, the magnetization of the pinned magnetic layer is not rigidly fixed in the height direction. Therefore, reproducing characteristics are deteriorated, including an increasing incidence of Barkhausen noises.

SUMMARY OF THE INVENTION

The present invention has been achieved to solve the above-mentioned problems of the prior art. It is, therefore, a principle object of the present invention to provide a spin-valve type thin film element in which the magnetization of a pinned magnetic layer can be induced and firmly fixed in a height direction by a magnetic field as a function of the magnetoelastic effect as well as by an exchange anisotropic magnetic filed.

The present invention provides a spin-valve type thin film element comprising an antiferromagnetic layer, a pinned magnetic layer being formed adjacent to the antiferromagnetic layer and having a magnetization orientation fixed or pinned by an exchange anisotropic magnetic field with respect to the antiferromagnetic layer, and a free magnetic layer formed over and/or under the pinned magnetic layer with the interposition of a nonmagnetic electrically conductive layer, wherein the element further comprises a bias magnetic layer for aligning the magnetization orientation of the free magnetic layer with a direction crossing the magnetization orientation of the pinned magnetic layer, and an electric conductive layer for feeding a sensing current to the pinned magnetic layer, the nonmagnetic electrically conductive layer and the free magnetic layer, the pinned magnetic layer is composed of a CoFe alloy, and the pinned magnetic layer has a positive saturated magnetostrictive constant and had a face central cubic structure (hereinafter referred to as "fcc structure") at least as a part of its crystal structure.

The CoFe alloy used as the pinned magnetic layer may have a composition formula represented by $Co_aFe_{100-a}$, and the composition ratio "a" may preferably be $30 \leq a \leq 80$, and more preferably be $50 \leq a \leq 70$ in terms of atomic percent.

The pinned magnetic layer according to the present invention may further includes Ni. In this case, the composition formula of the CoFeNi alloy can be represented by $Co_aFe_bNi_c$, and preferably, in terms of atomic percent, $0 \leq a \leq 80$, $20 \leq b \leq 70$ and $0 \leq c \leq 80$, and more preferably $50 \leq a \leq 80$, $20 \leq b \leq 50$ and $0 \leq c \leq 30$.

When the three segments of a ternary diagram of the aforementioned composition $Co_aFe_bNi_c$ are determined as the composition ratios of the elements Co, Fe and Ni respectively, the composition ratios a, b and c (atomic percent) may preferably fall in the range surrounded by the following four points.

(Co:Fe:Ni)=(70:30:0)
(Co:Fe:Ni)=(60:40:0)
(Co:Fe:Ni)=(50:30:20)
(Co:Fe:Ni)=(50:20:30)

The aforementioned antiferromagnetic layer according to the invention may be composed of a PtMn alloy.

Use of a PtMn alloy as the antiferromagnetic layer can provide a larger anisotropic magnetic field than those of FeMn alloys or NiMn alloys which have been conventionally used as an antiferromagnetic layer. In addition, such a PtMn alloy has satisfactory properties as an antiferromagnetic material including a high blocking temperature and an excellent corrosion resistance.

In the present invention, instead of the PtMn alloy, an X—Mn alloy, where X is Pd, Ru, Ir, Os or Rh, or a Pt—Mn—X' alloy, where X' is Ni, Pd, Rh, Ru, Ir, Cr or Co, can be employed as the antiferromagnetic layer.

As described above, a spin-valve type thin film element has upper, bottom and height side surfaces covered with an insulation film and an ABS side (front surface) exposed to the outside, and the coefficient of thermal expansion of the element is larger than that of the insulation film so that a tensile stress acts upon the spin-valve type thin film element in the height direction.

Thus, when the pinned magnetic layer has a negative magnetostriction, the magnetic field as a function of the magnetoelastic effect orients the magnetization orientation of the pinned magnetic layer in the track width direction. Accordingly, even if a large exchange anisotropic magnetic field can be obtained, the total magnitude of the whole magnetic field to orient the magnetization of the pinned magnetic layer in the height direction is reduced. Therefore, the magnetization of the pinned magnetic layer cannot be rigidly fixed in the height direction so as to deteriorate reproducing characteristics.

According to the present invention, the magnetostriction of a pinned magnetic layer is set to be positive so that the magnetization of the pinned magnetic layer is induced in the height direction as a function of the magnetoelastic effect. To be more specific, the magnetization of the pinned magnetic layer can be oriented and firmly fixed in the height direction as a function of an exchange anisotropic magnetic field and a magnetic field as a function of the magnetoelastic effect so as to obtain satisfactory reproducing characteristics.

The pinned magnetic layer in the present invention is formed of a CoFe alloy film or a CoFeNi alloy film.

Using a CoFe alloy or a CoFeNi alloy as the pinned magnetic layer, the present inventors conducted experiments concerning the relationship of composition ratios of magnetic materials to the magnetostriction and exchange anisotropic magnetic filed. The experimental methods and results thereof are described below.

Initially, a series of multilayered films were formed using CoFe alloys having different composition ratios as the pinned magnetic layer, and the relationship between the composition ratio of Co and the exchange anisotropic magnetic field ($H_{ex}$) was determined. Each of the multilayered films used in the experiment has the following film structure: Si/Substrate/Primary coat: Ta (50)/Antiferromagnetic layer: PtMn (300)/Pinned magnetic layer: CoFe (30)/Protective layer: Ta (100) In the above structure, the values in the parentheses in the layers respectively represent a thickness in Angstroms.

Each of the layers was formed by DC magnetron sputtering. The CoFe alloy film having a desired film composition was formed by using a composite target composed of a Co target and Fe pellets and adjusting the number of the pellets. The compositions of the obtained CoFe alloy films were analyzed by X ray microanalysis (XMA).

Thus-formed films were subjected to annealing in a magnetic field at a temperature of 240° C. for 3 hours. The applied magnetic field was 2,000 Oersteds (Oe).

The exchange anisotropic magnetic field was determined by VSM and evaluated by a shift of the flux reversal point from the original point.

Next, a series of multilayered films were formed using CoFe alloys having different composition ratios as the pinned magnetic layer, and the relationship between composition ratios of Co and the saturated magnetostrictive constant λs was determined. The multilayered films used in the experiment had a following film structure.

Si/Substrate/Primary coat: Ta (50)/Antiferromagnetic layer: PtMn (300)/Cu (50)/Pinned magnetic layer: CoFe (30)/Protective layer: Ta (100)
In the above structure, the values in the parentheses in the layers respectively represent a thickness in Angstroms.

The films were formed in the same method as in the above-mentioned measurement of the exchange anisotropic magnetic field except that heat treatment (annealing) was not conducted because a large exchange anisotropic magnetic field inhibits the magnetostriction from precise determination. In addition, a Cu film was interposed between the PtMn alloy film and the CoFe alloy film so as to completely shut off from exchange coupling between both the alloy films.

The magnetostriction was determined using the optical lever method by applying a magnetic field of ±200 Oe to each of the multilayered films.

In addition, a series of multilayered films were formed using each of CoFe alloy films having different composition ratios of Co as the pinned magnetic layer, and the crystal structures of the obtained pinned magnetic layers were determined. The multilayered films used in the test had a following film structure.

Si/Substrate/Primary coat: Ta (50)/Antiferromagnetic layer: PtMn (300)/Pinned magnetic layer: CoFe (100)/Protective layer: Ta (100)
In the above structure, the values in the parentheses in the layers each represents a thickness in Angstroms.

The thickness of the CoFe films in this test was set to as thick as 100 Angstroms in order to determine precise crystal structures.

The multilayered films were formed in the same manner as in the determination of the exchange anisotropic magnetic filed mentioned above.

The crystal structures were determined by X ray diffractometry which is usually employed. The crystal structures of the CoFe alloys could be determined from diffraction patterns obtained by X ray diffractometry.

The crystal structure, the value of the exchange anisotropic magnetic filed ($H_{ex}$) and the saturated magnetostrictive constant ($\lambda s$) in each of the CoFe alloy films having different compositions are shown in Table 1, and graphs obtained from these data in Table 1 are illustrated in FIG. 4.

TABLE 1

| Film composition (atomic %) | | Crystal structure | Exchange anisotropic magnetic field Hex (Oe) | Saturated magnetostricti ve constant $\lambda s$ ($\times 10^{-5}$) |
|---|---|---|---|---|
| Co | Fe | | | |
| 100 | 0 | fcc + hcp | 600 | −2.0 |
| 90 | 10 | fcc + hcp | 650 | −0.5 |
| 80 | 20 | fcc | 700 | +1.5 |
| 70 | 30 | fcc | 800 | +3.0 |
| 60 | 40 | fcc | 800 | +5.1 |
| 50 | 50 | fcc + bcc | 500 | +6.5 |
| 40 | 60 | fcc + bcc | 300 | +5.4 |
| 30 | 70 | fcc + bcc | 200 | +4.1 |
| 20 | 80 | bcc | 100 | +2.5 |

As apparent from FIG. 4, the peak of the exchange anisotropic magnetic field ($H_{ex}$) fell in the range of the composition ratio of Co ranging from 60 to 70 atomic percent, and when the composition ratio of Co was 30 atomic percent or more, an exchange anisotropic magnetic field of 200 Oe or more could be obtained.

The magnetostriction was maximized at a composition ratio of Co of about 50 atomic percent and decreased gradually at a composition ratio of Co of 50 atomic percent or more.

In particular, the magnetostriction became negative at a composition ratio of Co of about 90 atomic percent or more.

The crystal structures of the CoFe alloys at each of the composition ratios are shown under the graphs.

As shown in FIG. 4, the CoFe alloy was composed of bcc structure (body central cubic structure) as almost all of its crystal structure of at a composition ratio of Co of about 30 atomic percent or less, whereas it was composed of fcc structure (face central cubic structure) at least as a part of its crystal structure at about 30 atomic percent or more.

In particular, when CoFe alloy can give an exchange anisotropic magnetic field of 500 Oe or more, that is, it has a composition ratio of Co ranging from about 50 to about 80 atomic percent, almost all of its crystal structure is fcc structure.

Accordingly, it was found that the CoFe alloy preferably comprises fcc structure at least as a part of its crystal structure in order to obtain a large exchange anisotropic magnetic field.

The composition ratio of Co should preferably be 30 atomic percent or more, as is shown from the above-mentioned test results. When the composition ratio of Co is less than 30 atomic percent, the exchange anisotropic magnetic field is decreased so as to prevent the magnetization of the pinned magnetic layer from suitably putting into a single domain state and fixing.

Next, the relationship between composition ratios of Co and the incidence of head noises was determined using a series of CoFe alloys having different composition ratios of Co as the pinned magnetic layer. The multilayered films used in the experiment had a following film structure.

Si/Substrate/Primary coat: Ta (50)/Antiferromagnetic layer: PtMn (300)/Pinned magnetic layer: CoFe (30)/Nonmagnetic electrically conductive layer: Cu (25)/Free magnetic layer: NiFe (80)/Protective layer: Ta (50)

In the above structure, the value in the parenthesis for each of the layers represents a thickness in Angstroms. The NiFe alloy (free magnetic layer 4) had a composition ratio of (Ni:Fe)=(80:20).

The thin film magnetic head used in the test was an "inductive/spin-valve composite type thin film magnetic head comprising the aforementioned multilayered films (spin-valve films) and an "inductive magnetic head" for recording. In the test, a recording signal was written in a recording medium using the inductive magnetic head and then reproduced by the multilayered film.

The head noises were evaluated using an oscilloscope based on the incidence of Barkhausen noises occurred in a reading waveform in the multilayered film (spin-valve film). The test results are indicated in FIG. 5.

The head noise incidence was comparatively low at a composition ratio of Co ranging from about 30 to about 80 atomic percent, but remarkably increased over about 80 atomic percent, as illustrated in FIG. 5.

FIG. 6 is a graph showing the relationship between the saturated magnetostrictive constant $\lambda s$ and the head noise incidence.

As is apparent from FIG. 6, the head noise incidence decreased with a positive magnetostriction having an increasing absolute value, whereas it increased with a negative magnetostriction having an increasing absolute value.

In FIG. 5, the head noise incidence increased at a composition ratio of Co of 80 atomic percent or more. This is probably because the magnetostriction was near zero or negative at this composition ratio, as indicated in the results in FIG. 6.

The test results in FIG. 4 indicate that the magnetostriction approaches zero at a composition ratio of Co of 80 atomic percent or more, and in particular it becomes negative at 90 atomic percent or more.

In general, a stress acting on the element with a head having an exposed ABS side is believed to be a tensile stress of several hundreds MPa (mega Pascal). Provided that a tensile stress of 300 MPa acts on the head in the height direction, the anisotropy caused by the magnetoresistive effect with an absolute value of $(3/2)*\lambda s*\sigma$, wherein $\lambda s$ represents a saturated magnetostrictive constant and $\sigma$ represents a stress, acts in the height direction at $\lambda s$ higher than zero and in the track width direction at $\lambda s$ lower than zero. This is introduced from the theory of magnetism. According to this theory, the magnitude of a magnetic field as a function of the magnetoelastic effect was determined from the magnetostriction shown in FIG. 4, and the results are set forth in FIG. 7. In FIG. 7, the exchange anisotropic magnetic field ($H_{ex}$) as shown in FIG. 4 and a magnetic field as a total of the exchange anisotropic magnetic field and the magnetic field as a function of the magnetoelastic effect are also illustrated.

The magnetic field as a function of the magnetoelastic effect as is shown in the graph of FIG. 7 was maximized at a composition ratio of Co of about 50 atomic percent and gradually decreased over about 50 atomic percent. In particular, this value became negative at a composition ratio of Co equal to or more than 90 atomic percent.

When the magnitude of magnetic field as a function of the magnetoelastic effect approaches zero or becomes negative, the magnitude of a magnetic field as a total of the exchange anisotropic magnetic field and the magnetic field by the magnetoelastic effect is equal to or less than that of the exchange anisotropic magnetic field. This tendency is clearly shown in the range of the composition ratio of Co of 80 atomic percent or more in the graph of FIG. 7.

At a composition ratio of Co of about 50 atomic percent or less, the exchange anisotropic magnetic field was 500 Oe or less, whereas the magnetic field as a function of the magnetoelastic effect had a comparatively high magnitude, as illustrated in FIG. 7. Thus, the magnitude of a magnetic field as a total of the exchange anisotropic magnetic field and the magnetic field as a function of the magnetoelastic effect was comparatively large.

As described above, to fix the magnetization orientation of the pinned magnetic layer in the height direction firmly, the magnetic filed as a function of the magnetoelastic effect in addition to the exchange coupling magnetic field should be adequately controlled. Such a magnetic field as a function of the magnetoelastic effect can be determined by a magnetostriction and a stress acting on the pinned magnetic layer.

The magnetic field by the magnetoelastic effect has a small value or a negative value at a composition ratio of Co of 80 atomic percent or more, and then the magnetization of the pinned magnetic layer is induced in the track width direction as a function of the magnetoelastic effect so as to increase the head noise incidence as shown in FIG. 5.

Based upon the test results shown in FIGS. 4 to 7, when the pinned magnetic layer according to the present invention is formed of a CoFe alloy, the composition ratio of Co should preferably fall in the range from 30 to 80 atomic percent. Within the above specified range, the magnetostriction always has a positive large value, and the CoFe alloy comprises fcc structure at least as a part of its crystal structure so as to give an exchange anisotropic magnetic field of equal to or more than 200 Oe, as illustrated in FIG. 4.

In addition, within the above mentioned range, the head noise incidence can be reduced below 5%, as illustrated in FIG. 4.

More preferably, the composition ratio of Co in the present invention should fall in the range from 50 to 70 atomic percent. Within this range the pinned magnetic layer can have a positive and larger magnetostriction and a crystal structure almost all of which is fcc structure, and hence an exchange anisotropic magnetic field of equal to or more than 500 Oe can be obtained, as indicated in FIG. 4.

Further, as shown in FIG. 5, when the composition ratio of Co ranges from 50 to 70 atomic percent, the head noise incidence can be reduced below about 3%.

Next, using CoFeNi alloys having different composition ratios as the pinned magnetic layer, the crystal structure, exchange anisotropic magnetic field ($H_{ex}$) and saturated magnetostrictive constant $\lambda_s$ at each of the composition ratios were determined in the same test method as mentioned above. The test results are set forth in Table 2.

TABLE 2

| Film composition (atomic %) | | | Crystal structure | Exchange anisotropic magnetic field Hex (Oe) | Saturated magnetostrictive constant $\lambda s$ (× $10^{-5}$) |
| --- | --- | --- | --- | --- | --- |
| Co | Fe | Ni | | | |
| 50 | 40 | 10 | fcc + bcc | 600 | +4.7 |
| 50 | 30 | 20 | fcc + bcc | 800 | +3.4 |
| 50 | 20 | 30 | fcc | 800 | +1.7 |
| 50 | 10 | 40 | fcc | 700 | −0.5 |
| 50 | 0 | 50 | fcc | 700 | −2.5 |
| 0 | 80 | 20 | bcc | 200 | +1.5 |
| 0 | 70 | 30 | fcc + bcc | 500 | +3.5 |
| 0 | 30 | 70 | fcc | 600 | +3.0 |
| 0 | 20 | 80 | fcc | 700 | +0.3 |
| 0 | 10 | 90 | fcc | 700 | −2.0 |

As apparent from Table 2, when the composition ratio of Co was fixed at 50 atomic percent, the composition ratio of Fe was decreased from 40 atomic percent to 0 atomic percent at an interval of 10 atomic percent, and the composition ratio of Ni was increased from 10 atomic percent to 50 atomic percent at an interval of 10 atomic percent, the crystal structure changed from a composite structure of fcc structure and bcc structure to a single pure fcc structure.

Whereas the exchange anisotropic magnetic field ($H_{ex}$) increased with an increasing composition ratio of Ni, the magnetostriction decreases with a decreasing composition ratio of Fe and approached zero or became negative at a composition ratio of Fe of 20 atomic percent or less.

When the composition ratio of Co was fixed at 0 atomic percent, that of Fe was decreased from 80 atomic percent to 10 atomic percent and that of Ni was increased from 20 atomic percent to 90 atomic percent, the crystal structure altered from a pure bcc structure to a composite structure of fcc structure and bcc structure and further to a pure fcc structure.

Though the exchange anisotropic increased with an increasing composition ratio of Ni, the magnetostriction decreased with a decreasing composition ratio of Fe and approached zero or became negative at a composition ratio of Fe of 20 atomic percent or less.

As is shown in the test results mentioned above, when the composition ratio of Fe is set to 20 atomic percent or more, at least a positive magnetostriction can be obtained.

Each of the film structures indicated in Tables 1 and 2 are plotted in a ternary diagram as shown in FIG. 8.

According to the present invention, the composition ratios within the areas A, B, C and D illustrated in FIG. 8 are preferred, and the other areas, i.e., the areas in which the composition ratio of Fe is 20 atomic percent or less or 70 atomic percent or more, are excluded as disadvantageous.

The composition ratio of Fe of equal to or less than 20 atomic percent is disadvantageous because the magnetostriction may quite possibly become negative, as described above. As indicated in Tables 1 and 2, it was found that the magnetostriction exhibited a negative value at a composition ratio of Fe of 10 or 0 atomic percent.

The composition ratio of Fe of equal to or more than 70 atomic percent is disadvantageous because most of or all of the alloy comprises bcc structure so as to extremely decrease the exchange anisotropic magnetic field.

When the pinned magnetic layer according the present invention is formed of a CoFeNi alloy, the composition ratios should preferably fall in the areas A, B, C and D illustrated in FIG. 8. In other words, the preferred composition ratios of Co, Fe and Ni range from 0 to 80 atomic percent, from 20 to 70 atomic percent and from 0 to 80 atomic percent, respectively.

Within the aforementioned composition ratios, the magnetostriction is always positive and at least a part of the crystal structure is composed of fcc structure, whereas an exchange anisotropic magnetic field of 200 Oe or more can be obtained.

The composition ratios in the areas B, C and D, in which the composition ratios of Co, Fe and Ni range from 50 to 80 atomic percent, from 20 to 50 atomic percent and from 0 to 30 atomic percent, respectively, are more advantages.

Within the aforementioned composition ratios, the magnetostriction is always positive and at least a part of the crystal structure is composed of fcc structure, and an exchange anisotropic magnetic field of 500 Oe or more can be obtained.

The most advantageous composition ratios fall in the area D indicated in FIG. 8, i.e. the range surrounded by the following 4 points:

(Co:Fe:Ni)=(70:30:0)

(Co:Fe:Ni)=(60:40:0)

(Co:Fe:Ni)=(50:30:20)

(Co:Fe:Ni)=(50:20:30)

Within the aforementioned range, a positive and comparatively large magnetostriction can be obtained, and the layer has possibly a pure fcc structure as its crystal structure so that an exchange anisotropic magnetic field of equal to or more than 800 Oe can be obtained.

As described above, the present invention enables the pinned magnetic layer to have a positive magnetostriction and to comprise fcc structure by forming the pinned magnetic layer of a CoFe alloy or a CoFeNi alloy and adjusting the composition ratios of the constituting alloy.

Accordingly, the magnetization of the pinned magnetic layer can be induced in the height direction as a function of the magnetoelastic effect determined by a stress and a magnetostriction, and in addition, a large exchange anisotropic magnetic field can be obtained simultaneously. Thus, the magnetization of the pinned magnetic layer can be put and rigidly fixed into a single domain state in the height direction by a magnetic field as a total of the magnetic field by the magnetoelastic effect and the exchange anisotropic magnetic field, so as to reduce Barkhausen noises and enhance reproducing characteristics.

DESCRIPTION OF THE PREFERRED EMBODIMENT

Figure 1:
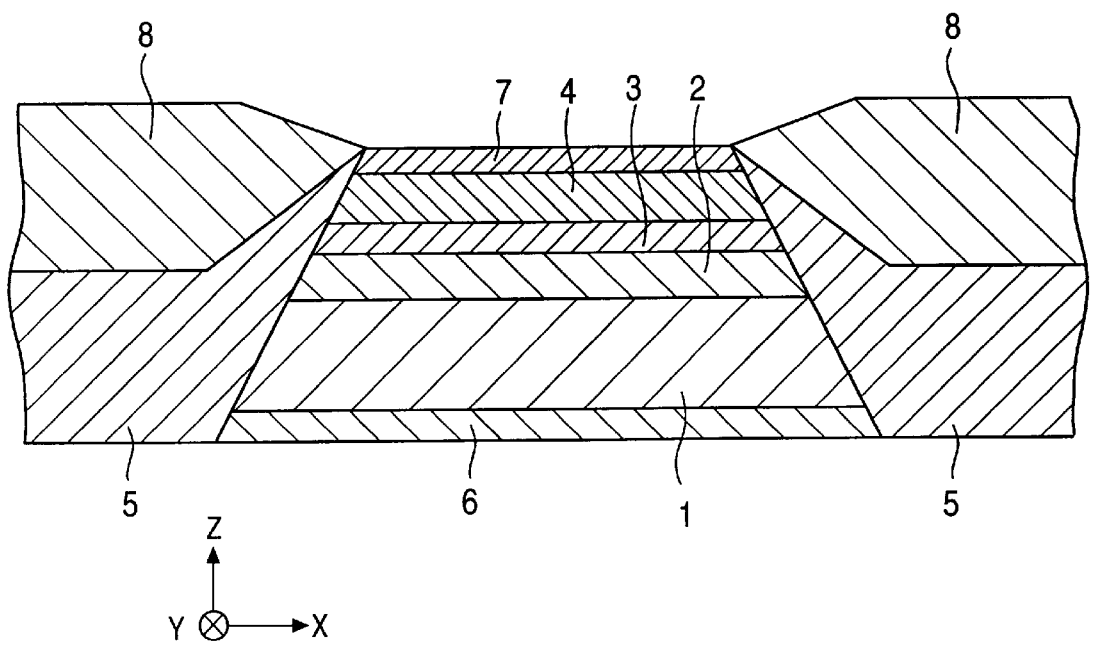
FIG. 1 is a cross-section view illustrating, from an Air Bearing surface side, the structure of a first embodiment of a spin-valve type thin film element of the present invention.
Figure 2:
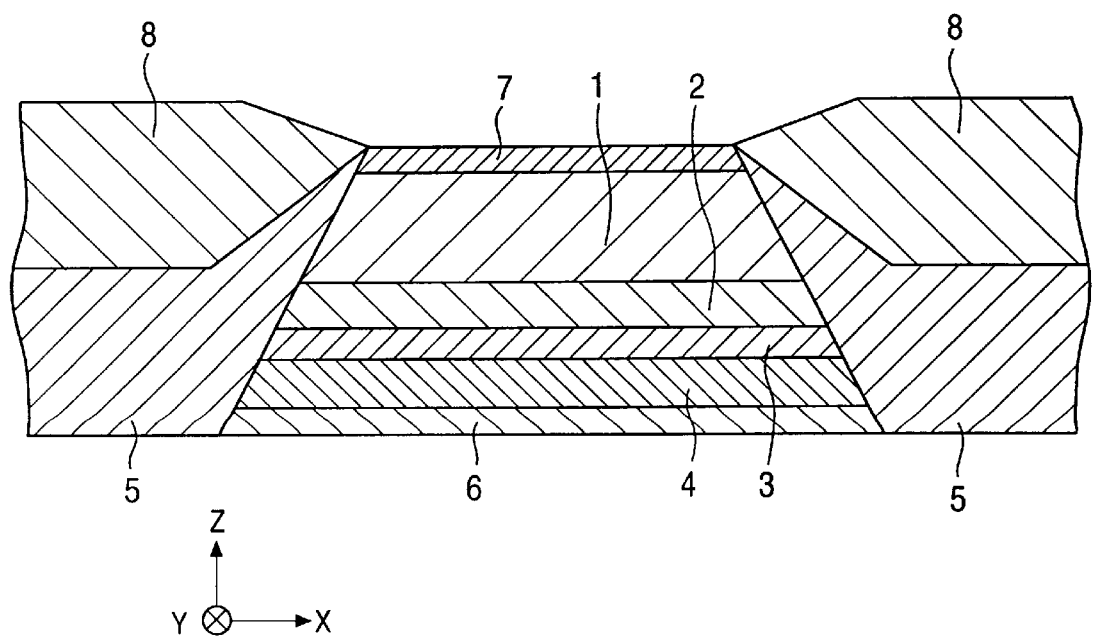
FIG. 2 is a cross-section view of, , the structure of a second embodiment of the spin-valve type thin film element according to the present invention illustrated from an Air Bearing surface side.
Figure 3:
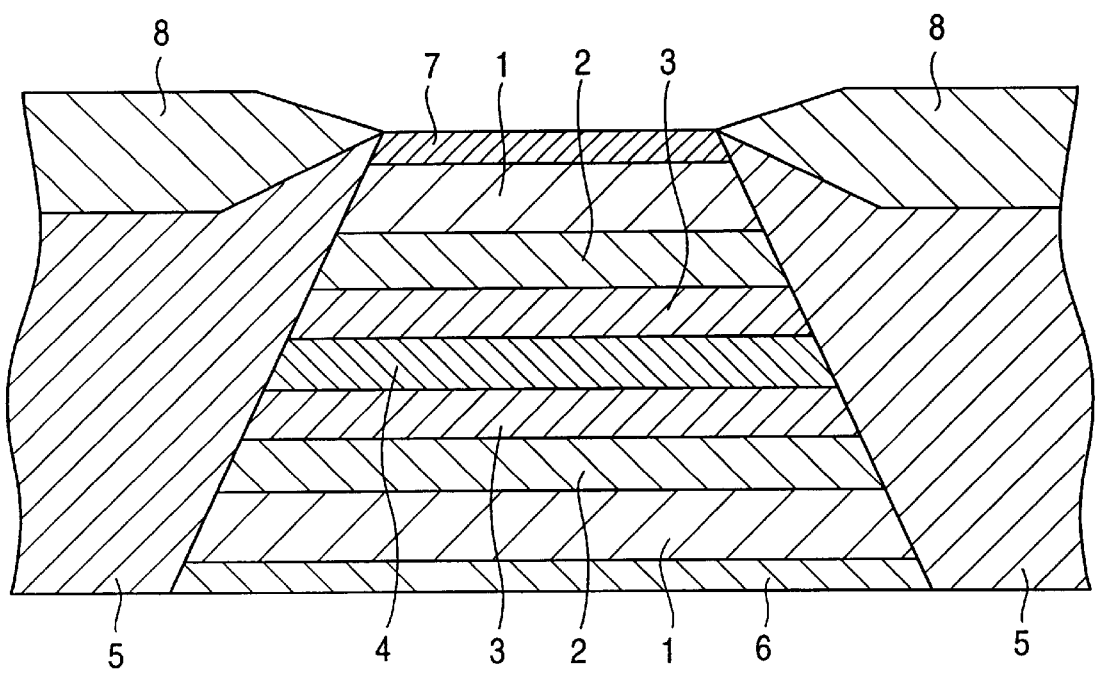
FIG. 3 is a cross-section view illustrating, from an Air Bearing surface side, the structure of a third embodiment of the spin-valve type thin film element according to the present invention.

FIGS. 1, 2 and 3 respectively illustrate the structures of embodiments of the spin-valve type thin film element of the present invention; which are cross-section views illustrated from the ABS side, where only the central part of the element elongating in the X axis is cut away.

The spin-valve type thin film elements shown in FIGS. 1, 2 and 3 have upper, bottom and height side surfaces covered or coated with an insulation film (gap film) formed of, for example, $Al_2O_3$ or $SiO_2$, and only an ABS side (front surface) being exposed to the outside.

In each of the spin-valve type thin film elements illustrated in FIGS. 1, 2 and 3, its coefficient of thermal expansion is larger than that of the insulation film covering the thin film element, so that a tensile stress ranging about 200 MPa to about 300 MPa acts on the thin film element in the Y direction (height direction) shown in the figures.

Each of the spin-valve type thin film elements illustrated in FIGS. 1 to 3 is to be disposed on a trailing side end of a floating type slider equipped in a hard disk drive for detecting a recording magnetic field of a hard disk, for instance. Incidentally, such a hard disk moves in the Z direction, and a leakage magnetic field from a magnetic recording medium is oriented in the Y direction.

The lowest layer in the embodiments of FIGS. 1 to 3 is a primary coat 6 formed of a nonmagnetic material such as Ta (tantalum).

In the embodiment of FIG. 1, an antiferromagnetic layer 1, a pinned magnetic layer 2, a nonmagnetic electrically conductive layer 3 and a free magnetic layer 4 are formed by laminating onto the primary coat 6 in succession.

Onto the primary coat 6 in FIG. 2, a free magnetic layer 4, a nonmagnetic electrically conductive layer 3, a pinned magnetic layer 2 and an antiferromagnetic layer 1 are sequentially laminated.

In FIG. 3, the element is composed of a free magnetic layer 4, nonmagnetic electrically conductive layers 3,3 formed on both sides of the free magnetic layer 4, pinned magnetic layers 2,2 formed onto one, and below the other of the nonmagnetic electrically conductive layers 3,3, and antiferromagnetic layers 1,1 formed onto one, and below the other of the pinned magnetic layers 2,2, and this laminate is formed on the primary coat 6.

The most upper layer in the embodiments shown in FIGS. 1 to 3 is a protective layer 7 composed of a nonmagnetic material such as Ta (tantalum).

The six species of the layers from the primary coat 6 to the protective layer 7 are laminated by, for example, the sputtering method and then both sides of the resultant laminate are cut into slant as illustrated in FIGS. 1 to 3. Onto the both sides of the laminate, hard magnetic bias layers 5,5 are formed, and then electric conductive layers 8,8 are laminated onto the hard magnetic bias layers 5,5, respectively.

Materials of each of the aforementioned layers will be described below.

According to the embodiments of the present invention, the antiferromagnetic layer 1 is formed of a PtMn alloy. Such a PtMn alloy has satisfactory characteristics as an antiferromagnetic material, including a more excellent thermostability, a higher blocking temperature and a larger exchange anisotropic magnetic field ($H_{ex}$) than FeMn alloys or the like. In addition, when the antiferromagnetic layer 1 formed of a PtMn alloy is formed under the pinned magnetic layer 2 as shown in FIG. 1 or on the pinned magnetic layer 2 as illustrated in FIG. 2, an exchange anisotropic magnetic field can be obtained in a boundary face (interface) between the antiferromagnetic layer 1 and the pinned magnetic layer 2.

As the antiferromagnetic layer 1, an X—Mn alloy, where X is Pd, Ru, Ir, Os or Rh, or a Pt—Mn—X' alloy, where X' is Ni, Pd, Rh, Ru, Ir, Cr or Co, can be employed in lieu of a PtMn alloy.

In the Pt—Mn alloy and X—Mn alloy, the composition ratio of Pt or X with respect to Mn is preferably such that (Pt, X):Mn is from 1:9 to 3:7 or from 1:0.7 to 1:1.3, and more preferably 1:1.

According to the embodiments of the present invention, the pinned magnetic layer 2 is formed of a CoFe alloy or a CoFeNi alloy. The composition ratios in these materials will be described below.

The free magnetic layer 4 can be formed of any of the magnetic materials used as the pinned magnetic layer 2, or of Co or an NiFe alloy.

The nonmagnetic electrically conductive layer 3 may be formed of Cu; the hard magnetic bias layers 5,5 can be composed of a Co—Pt (cobalt-platinum) alloy or a Co—Cr—Pt (cobalt-chromium-platinum) alloy; and the electric conductive layers 8,8 are formed of W (tungsten) or Cu (copper), for example.

As illustrated in FIGS. 1 to 3, the pinned magnetic layer 2 is formed adjacent to or contact with the antiferromagnetic layer 1, and heat treatment is conducted under this condition in an applied magnetic field in the Y direction (height direction: the direction of a leakage magnetic field from a recording medium) to give an exchange anisotropic magnetic field in a boundary face between both the layers. Accordingly, the magnetization orientation of the pinned magnetic layer 2 is put into a single domain state in the Y direction and fixed.

The hard magnetic bias layers 5,5 are magnetized in the X direction shown in the figures (track width direction), and the magnetization orientation of the free magnetic layer 4 is aligned with the X direction under the influence of the hard magnetic bias layers 5,5.

In the spin-valve type thin film elements illustrated in FIGS. 1 to 3, when a steady-state current (sensing current) is fed from the electric conductive layer 8 to the pinned magnetic layer 2, the nonmagnetic electrically conductive layer 3 and the free magnetic layer 4, and a magnetic field is provided from a recording medium in the Y direction, the magnetization orientation of the free magnetic layer 4 rotates from the X direction to the Y direction. In this circumstances, electrons moving from one layer to the other layer between the free magnetic layer 4 and the pinned magnetic layer 2 diffuses or scatters in a boundary face (interface) between the nonmagnetic electrically conductive layer 3 and the pinned magnetic layer 2 or between the nonmagnetic electrically conductive layer 3 and the free magnetic layer 4 so as to invite the electric resistance to vary. Thus, the steady-state current varies, and thereby a sensing output is obtained.

Incidentally, the single spin-valve type thin film element shown in FIGS. 1 and 2 has two sites where electrons scatter depending on spin, i.e., one boundary face between the nonmagnetic electrically conductive layer 3 and the free magnetic layer 4 and one boundary face between the nonmagnetic electrically conductive layer 3 and the pinned magnetic layer 2. On the contrary, the dual spin-valve type thin film element illustrated in FIG. 3 has a total of four sites where conduction electrons scatter, i.e., two boundary faces between the nonmagnetic electrically conductive layer 3 and the free magnetic layer 4 and two boundary faces between the nonmagnetic electrically conductive layer 3 and the pinned magnetic layer 2. Accordingly, the dual spin-valve type thin film element can provide a larger rate of electric resistance change than the single spin-valve type thin film element.

To fix the magnetization orientation of the pinned magnetic layer 2 in the Y direction more firmly, the composition ratios of the CoFe alloy or CoFeNi alloy used as the pinned magnetic layer according to the invention should adequately be adjusted so as to give a positive magnetostriction and to contain fcc structure (face central cubic structure) at least as a part of its crystal structure.

In each of the spin-valve type thin film elements illustrated in FIGS. 1 to 3, only the ABS side (front surface) is exposed to the outside and the other surfaces are covered with an insulation film, so that a tensile stress acts on the element in the Y direction (height direction), as described above.

Accordingly, when the magnetostriction of the pinned magnetic layer 2 is set to be positive, the magnetization of the pinned magnetic layer can be induced in the Y direction as a function of the magnetoelastic effect.

In addition, since the pinned magnetic layer is composed of fcc structure at least as a part of its crystal structure, a large exchange anisotropic magnetic field can be obtained, which enables the pinned magnetic layer 2 to be put into a single domain state in the Y direction more rigidly.

As thus described, the present invention where the magnetostriction of the pinned magnetic layer is set to be positive so as to induce the magnetization of this layer in the Y direction as a function of the magnetoelastic effect enables the magnetization orientation of the pinned magnetic layer 2 to be fixed in the Y direction more firmly than conventional equivalents where only an exchange anisotropic magnetic field is controlled.

Figure 4:
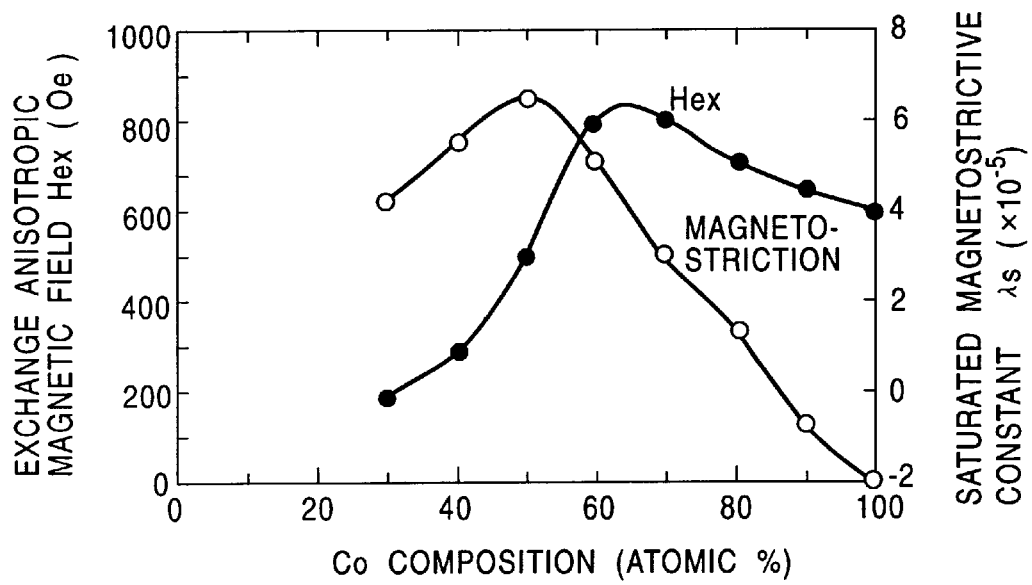
FIG. 4 is a graph showing the relationship of composition ratios of Co with respect to an exchange anisotropic magnetic field ($H_{ex}$) and a magnetostriction, and a diagram illustrating crystal structures in each of the composition ratios in a pinned magnetic layer formed of a CoFe alloy.
Figure 5:
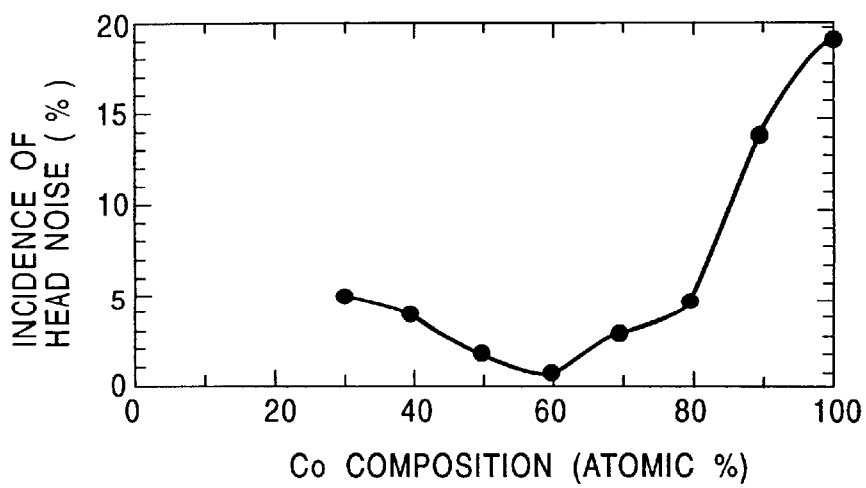
FIG. 5 is a graph showing the relationship between various composition ratios of Co and head noise incidences in a pinned magnetic layer formed of a CoFe alloy.
Figure 6:
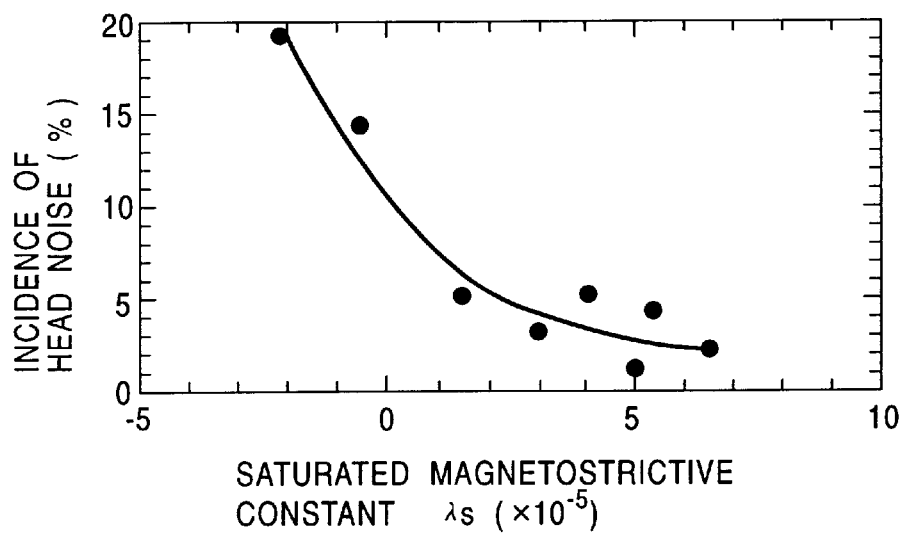
FIG. 6 is a graph illustrating the relationship between a magnetostriction and a head noise incidence.
Figure 7:
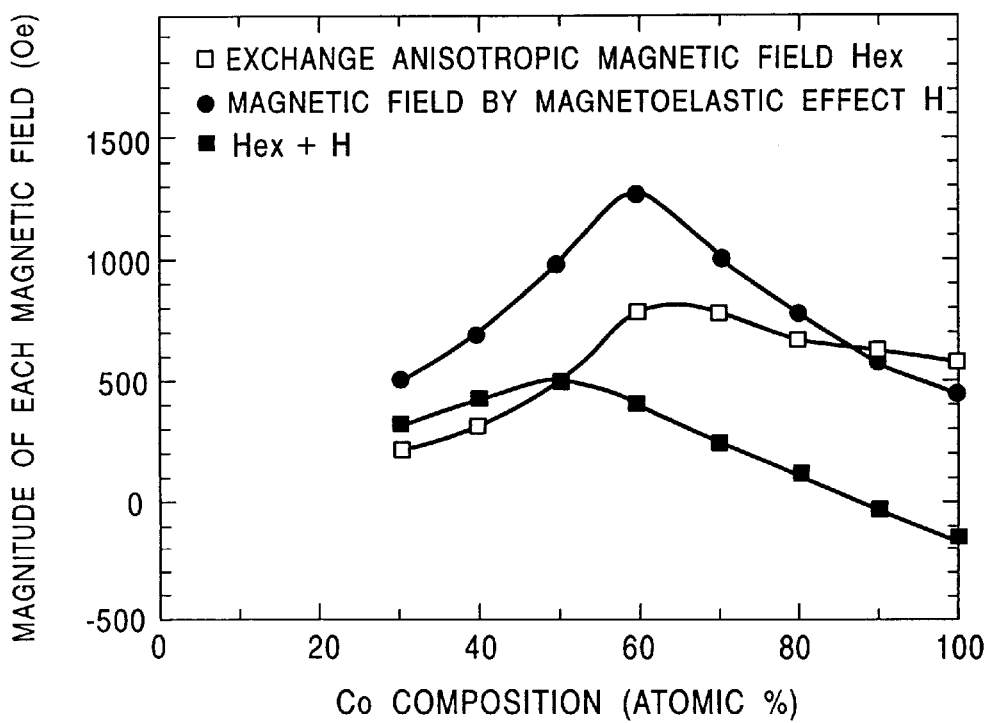
FIG. 7 is a graph showing the relationship of different composition ratios of Co with respect to a magnetic field as a function of the magnetoelastic effect, an exchange anisotropic magnetic field and a magnetic field as a total of the magnetic field as a function of the magnetoelastic effect and the exchange anisotropic magnetic field in a pinned magnetic layer formed of a CoFe alloy.

When the pinned magnetic layer 2 is formed of a CoFe alloy film, it preferably comprises Co in a composition ratio ranging from 30 to 80 atomic percent. Within this range, a positive magnetostriction can be obtained and the film can comprise fcc structure at least as a part of its crystal structure and hence an exchange anisotropic magnetic field of equal to or more than 200 Oe can be obtained, as shown in FIG. 4.

More preferable composition ratio of Co falls in the range from 50 to 70 atomic percent. Within the range just mentioned, as illustrated in FIG. 4, a positive large magnetostriction can be obtained and the film can comprise fcc structure in a large ratio to thereby obtain an exchange anisotropic magnetic field of equal to or more than 500 Oe.

When the pinned magnetic layer 2 of the invention is formed of a CoFeNi alloy film, it should preferably comprise Co, Fe and Ni in composition ratios ranging from 0 to 80 atomic percent, from 20 to 70 atomic percent and from 0 to 80 atomic percent, respectively.

Figure 8:
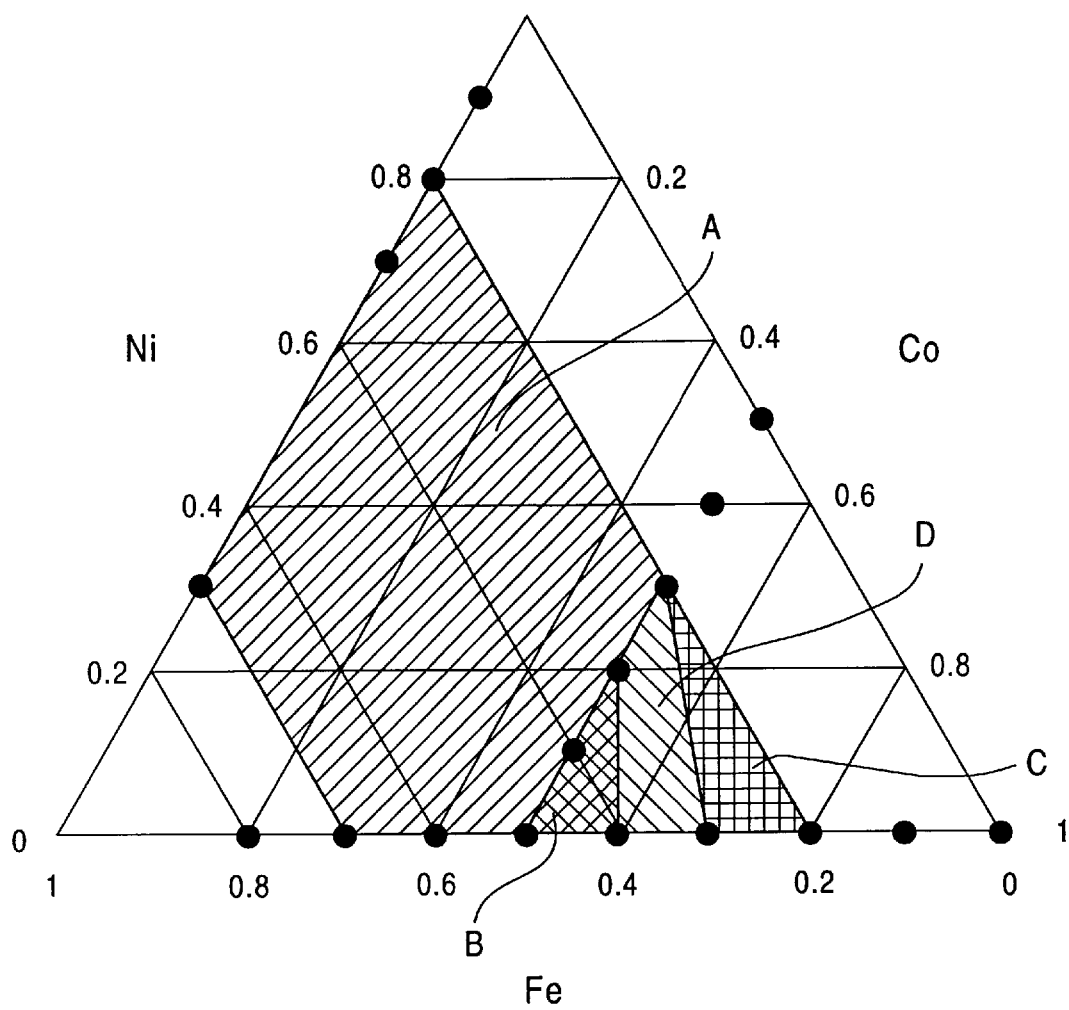
FIG. 8 is a ternary diagram showing preferred composition ratios in a pinned magnetic layer formed of a CoFeNi according to the present invention.

The composition ratios within these ranges correspond to the areas A, B, C and D in the ternary diagram shown in FIG. 8. Within these areas, a positive magnetostriction can be obtained and the film can comprise fcc structure at least as a part of its crystal structure so as to give an exchange anisotropic magnetic field of equal to or more than 200 Oe.

More preferably, the layer comprises Co, Fe and Ni in composition ratios ranging from 50 to 80 atomic percent, from 20 to 50 atomic percent and from 0 to 30 atomic percent, respectively.

The composition ratios within these ranges correspond to the areas B, C and D in the ternary diagram illustrated in FIG. 8. A positive large magnetostriction can be obtained and the film can comprise fcc structure at least a part of its crystal structure to thereby obtain an exchange anisotropic magnetic field of equal to or more than 500 Oe within the areas just mentioned.

The most advantageous composition ratios in this embodiment should fall in the area D indicated in FIG. 8 surrounded by the following four points:

A (Co:Fe:Ni)=(70:30:0)
B (Co:Fe:Ni)=(60:40:0)
C (Co:Fe:Ni)=(50:30:20)
D (Co:Fe:Ni)=(50:20:30)

Within the aforementioned range, a positive and comparatively large magnetostriction can be obtained, and the layer can comprise fcc structure as almost all of its crystal structure so that an exchange anisotropic magnetic field of equal to or more than 800 Oe can be obtained.

The present invention as described above can provide a positive magnetostriction by adjusting the composition ratios of the pinned magnetic layer. Thus the magnetization of the pinned magnetic layer is induced in the Y direction indicated in the figures as a function of the magnetoelastic effect which is determined by the magnetostriction and the stress.

In addition within the above specified composition ratios, the pinned magnetic layer can have a positive magnetostriction and comprise fcc structure at least as a part of its crystal structure to thereby give a large exchange anisotropic magnetic field.

According to the present invention, the magnetization orientation of the pinned magnetic layer 2 can be directed to the Y direction by a magnetic field as a function of the magnetoelastic effect in addition to an exchange anisotropic magnetic field, and hence it can be put into a single domain state and fixed rigidly. Therefore, Barkhausen noises can be reduced and reproducing characteristics can be improved.

When the coefficient of thermal expansion of the spin-valve type thin film element is smaller than that of a film covering the other surfaces than the ABS side of the spin-valve type thin film element, or when the process of planished lapping of the ABS side is suitably selected, a stress to shrink in the Y direction can act upon the element.

In this case, the magnetization of the pinned magnetic layer 2 can be induced in the Y direction as a function of the magnetoelastic effect by setting the magnetostriction of this layer to negative so that Barkhausen noises can be reduced.

According to the present invention as described in detail above, when a tensile stress acts on the spin-valve thin film element in the height direction, the magnetization of the pinned magnetic layer can be induced in the height direction as a function of the magnetoelastic effect by suitably adjusting the composition ratios in magnetic materials of a CoFe alloy or a CoFeNi alloy used as the pinned magnetic layer and rendering the magnetostriction of the pinned magnetic layer to be positive.

In addition, the present invention can provide a large exchange anisotropic magnetic field by rendering the magnetostriction to be positive and allowing the pinned magnetic layer to comprise fcc structure at least as a part of its crystal structure of the pined magnetic layer.

According to the present invention, a large exchange anisotropic magnetic field can be obtained and the magnetization of the pinned magnetic layer is induced in the height direction as a function of the magnetoelastic effect, and can put and fix the magnetization of the pinned magnetic layer into a single domain state, Barkhausen noises can be decreased.

Other embodiments and variations will be obvious to those skilled in this art, this invention is not to be limited except as set forth in the following claims.

What is claimed is:

1. A spin-valve thin film element comprising:
an antiferromagnetic layer;
a pinned magnetic layer being formed adjacent to the antiferromagnetic layer and having a magnetization orientation fixed by an exchange anisotropic magnetic field between said pinned magnetic layer and the antiferromagnetic layer, said pinned magnetic layer being formed of a CoFe alloy, said pinned magnetic layer having a positive saturated magnetostrictive constant, and a part of a crystal structure of said pinned magnetic layer comprises an fcc structure;
a free magnetic layer formed over the pinned magnetic layer with a nonmagnetic electrically conductive layer disposed therebetween;
a bias magnetic layer to align a magnetization orientation of the free magnetic layer in a direction crossing the magnetization orientation of the pinned magnetic layer; and
an electric conductive layer to provide a sensing current to the pinned magnetic layer, the nonmagnetic electrically conductive layer and the free magnetic layer.

2. The spin-valve thin film element as claimed in claim 1, wherein the CoFe alloy is $Co_aFe_{100-a}$, where $30 \leq a \leq 80$ in terms of atomic percent.

3. The spin-valve thin film element as claimed in claim 1, wherein the pinned magnetic layer further includes Ni.

4. The spin-valve thin film element as claimed in claim 1, wherein the antiferromagnetic layer is composed of a PtMn alloy.

5. The spin-valve thin film element as claimed in claim 2, wherein the CoFe alloy is $Co_aFe_{100-a}$, where $50 \leq a \leq 70$ in terms of atomic percent.

6. The spin-valve thin film element as claimed in claim 2, wherein the antiferromagnetic layer is composed of a PtMn alloy.

7. The spin-valve thin film element as claimed in claim 3, wherein the CoFeNi alloy is $Co_aFe_bNi_c$, where $0 \leq a \leq 80$, $20 \leq b \leq 70$ and $0 \leq c \leq 80$ in terms of atomic percent.

8. The spin-valve thin film element as claimed in claim 3, wherein the antiferromagnetic layer is composed of a PtMn alloy.

9. The spin-valve thin film element as claimed in claim 1, wherein the antiferromagnetic layer is composed of one of an X—Mn alloy, where X is selected from Pd, Ru, Ir, Os and Rh, and a Pt—Mn—X' alloy, where X' is selected from Ni, Pd, Rh, Ru, Ir, Cr and Co.

10. The spin-valve thin film element as claimed in claim 5, wherein the antiferromagnetic layer is composed of a PtMn alloy.

11. The spin-valve thin film element as claimed in claim 2, wherein the antiferromagnetic layer is composed of one of an X—Mn alloy, where X is selected from Pd, Ru, Ir, Os and Rh, and a Pt—Mn—X' alloy, where X' is selected from Ni, Pd, Rh, Ru, Ir, Cr and Co.

12. The spin-valve thin film element as claimed in claim 7, wherein the CoFeNi alloy is $Co_aFe_bNi_c$, where $50 \leq a \leq 80$, $20 \leq b \leq 50$ and $0 \leq c \leq 30$ in terms of atomic percent.

13. The spin-valve thin film element as claimed in claim 7, wherein the antiferromagnetic layer is composed of a PtMn alloy.

14. The spin-valve thin film element as claimed in claim 3, wherein the antiferromagnetic layer is composed of one of an X—Mn alloy, where X is selected from Pd, Ru, Ir, Os and Rh, and a Pt—Mn—X' alloy, where X' is selected from Ni, Pd, Rh, Ru, Ir, Cr and Co.

15. The spin-valve thin film element as claimed in claim 5, wherein the antiferromagnetic layer is composed of one of an X—Mn alloy, where X is selected from Pd, Ru, Ir, Os and Rh, and a Pt—Mn—X' alloy, where X' is selected from Ni, Pd, Rh, Ru, Ir, Cr and Co.

16. The spin-valve thin film element as claimed in claim 12, wherein the CoFeNi alloy is $Co_aFe_bNi_c$, where the composition ratios a, b and c in terms of atomic percent fall in the area surrounded by the following four points provided that the composition ratios of Co, Fe and Ni respectively constitute three segments of a ternary diagram of $Co_aFe_bNi_c$:
(Co:Fe:Ni)=(70:30:0)
(Co:Fe:Ni)=(60:40:0)
(Co:Fe:Ni)=(50:30:20)
(Co:Fe:Ni)=(50:20:30).

17. The spin-valve thin film element as claimed in claim 7, wherein the antiferromagnetic layer is composed of one of an X—Mn alloy, where X is selected from Pd, Ru, Ir, Os and Rh, and a Pt—Mn—X' alloy, where X' is selected from Ni, Pd, Rh, Ru, Ir, Cr and Co.

18. The spin-valve thin film element as claimed in claim 16, wherein the antiferromagnetic layer is composed of a PtMn alloy.

19. The spin-valve thin film element as claimed in claim 16, wherein the antiferromagnetic layer is composed of one of an X—Mn alloy, where X is selected from Pd, Ru, Ir, Os and Rh, and a Pt—Mn—X' alloy, where X' is selected from Ni, Pd, Rh, Ru, Ir, Cr and Co.

20. A spin-valve thin film element comprising:
an antiferromagnetic layer;
a pinned magnetic layer being formed adjacent to the antiferromagnetic layer and having a magnetization orientation fixed by an exchange anisotropic magnetic field between said pinned magnetic layer and the antiferromagnetic layer, said pinned magnetic layer being formed of a CoFe alloy, said pinned magnetic layer having a positive saturated magnetostrictive constant, and a part of a crystal structure of said pinned magnetic layer is an fcc structure;
a free magnetic layer formed under the pinned magnetic layer with a nonmagnetic electrically conductive layer disposed therebetween;
a bias magnetic layer to align a magnetization orientation of the free magnetic layer in a direction crossing the magnetization orientation of the pinned magnetic layer; and
an electric conductive layer to provide a sensing current to the pinned magnetic layer, the nonmagnetic electrically conductive layer and the free magnetic layer.

21. The spin-valve thin film element as claimed in claim 20, wherein the CoFe alloy is $Co_aFe_{100-a}$, where $30 \leq a \leq 80$ in terms of atomic percent.

22. The spin-valve thin film element as claimed in claim 20, wherein the pinned magnetic layer further includes Ni.

23. The spin-valve thin film element as claimed in claim 20, wherein the antiferromagnetic layer is composed of a PtMn alloy.

24. The spin-valve thin film element as claimed in claim 21, wherein the CoFe alloy is $Co_aFe_{100-a}$, where $50 \leq a \leq 70$ in terms of atomic percent.

25. The spin-valve thin film element as claimed in claim 21, wherein the antiferromagnetic layer is composed of a PtMn alloy.

26. The spin-valve thin film element as claimed in claim 22, wherein the CoFeNi alloy is $Co_aFe_bNi_c$, where $0 \leq a \leq 80$, $20 \leq b \leq 70$ and $0 \leq c \leq 80$ in terms of atomic percent.

27. The spin-valve thin film element as claimed in claim 22, wherein the antiferromagnetic layer is composed of a PtMn alloy.

28. The spin-valve thin film element as claimed in claim 20, wherein the antiferromagnetic layer is composed of one of an X—Mn alloy and a Pt—Mn—X' alloy, where X is selected from Pd, Ru, Ir, Os and Rh and X' is selected from Ni, Pd, Rh, Ru, Ir, Cr and Co.

29. The spin-valve thin film element as claimed in claim 24, wherein the antiferromagnetic layer is composed of a PtMn alloy.

30. The spin-valve thin film element as claimed in claim 21, wherein the antiferromagnetic layer is composed of one of an X—Mn alloy and a Pt—Mn—X' alloy, where X is selected from Pd, Ru, Ir, Os and Rh and X' is selected from Ni, Pd, Rh, Ru, Ir, Cr and Co.

31. The spin-valve thin film element as claimed in claim 26, wherein the CoFeNi alloy is $Co_aFe_bNi_c$, where $50 \leq a \leq 80$, $20 \leq b \leq 50$ and $0 \leq c \leq 30$ in terms of atomic percent.

32. The spin-valve thin film element as claimed in claim 26, wherein the antiferromagnetic layer is composed of a PtMn alloy.

33. The spin-valve thin film element as claimed in claim 22, wherein the antiferromagnetic layer is composed of one of an X—Mn alloy and a Pt—Mn—X' alloy, where X is selected from Pd, Ru, Ir, Os and Rh and X' is selected from Ni, Pd, Rh, Ru, Ir, Cr and Co.

34. The spin-valve thin film element as claimed in claim 24, wherein the antiferromagnetic layer is composed of one of an X—Mn alloy and a Pt—Mn—X' alloy, where X is selected from Pd, Ru, Ir, Os and Rh and X' is selected from Ni, Pd, Rh, Ru, Ir, Cr and Co.

35. The spin-valve thin film element as claimed in claim 31, wherein the CoFeNi alloy is $Co_aFe_bNi_c$, where the composition ratios a, b and c in terms of atomic percent fall in the area surrounded by the following four points provided that the composition ratios of Co, Fe and Ni respectively constitute three segments of a ternary diagram of $Co_aFe_bNi_c$:
(Co:Fe:Ni)=(70:30:0)
(Co:Fe:Ni)=(60:40:0)
(Co:Fe:Ni)=(50:30:20)
(Co:Fe:Ni)=(50:20:30).

36. The spin-valve thin film element as claimed in claim 26, wherein the antiferromagnetic layer is composed of one of an X—Mn alloy and a Pt—Mn—X' alloy, where X is selected from Pd, Ru, Ir, Os and Rh and X' is selected from Ni, Pd, Rh, Ru, Ir, Cr and Co.

37. The spin-valve thin film element as claimed in claim 35, wherein the antiferromagnetic layer is composed of a PtMn alloy.

38. The spin-valve thin film element as claimed in claim 35, wherein the antiferromagnetic layer is composed of one of an X—Mn alloy and a Pt—Mn—X' alloy, where X is selected from Pd, Ru, Ir, Os and Rh and X' is selected from Ni, Pd, Rh, Ru, Ir, Cr and Co.

* * * * *